(12) United States Patent
Ohtsuki

(10) Patent No.: US 6,541,117 B1
(45) Date of Patent: Apr. 1, 2003

(54) SILICON EPITAXIAL WAFER AND A METHOD FOR PRODUCING IT

(75) Inventor: Tsuyoshi Ohtsuki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 80 days.

(21) Appl. No.: 09/688,090

(22) Filed: Oct. 16, 2000

(30) Foreign Application Priority Data

Oct. 19, 1999 (JP) ............................................ 11-297309
Apr. 25, 2000 (JP) ........................................ 2000-124586

(51) Int. Cl.⁷ ................................................. B32B 9/00
(52) U.S. Cl. ........................ 428/428; 428/432; 428/446; 257/629
(58) Field of Search ................................ 428/446, 64.1, 428/428, 432; 257/618, 620, 627, 628, 629

(56) References Cited

U.S. PATENT DOCUMENTS 5,557,627 A * 9/1996 Schneider, Jr. et al. ....... 372/46
5,935,320 A * 8/1999 Graef et al. .................... 117/2

FOREIGN PATENT DOCUMENTS

| JP | 10-229093 | * 8/1998 |
| JP | 11-189493 | * 7/1999 |
| JP | 11-216683 | 8/1999 |

* cited by examiner

Primary Examiner—Cathy Lam
(74) Attorney, Agent, or Firm—Oliff & Berridge, PLC

(57) ABSTRACT

There is disclosed a silicon epitaxial wafer comprising an epitaxial layer formed on a silicon wafer wherein Erratic phenomenon does not occur in a MOS device fabricated on the silicon epitaxial wafer, a silicon epitaxial wafer having oxide dielectric breakdown voltage of 20 MV/cm or more, a silicon epitaxial wafer comprising an epitaxial layer formed on a silicon wafer wherein oxygen concentration at an interface between the epitaxial layer and the silicon wafer of the silicon epitaxial wafer is $1\times10^{17}$ to $1\times10^{18}$ atoms/cm³ or $5\times10^{16}$ to $5\times10^{17}$ atoms/cm³, a method for producing a silicon epitaxial wafer comprising subjecting a silicon wafer to heat treatment in a hydrogen atmosphere, and then growing an epitaxial layer on the silicon wafer wherein the initial oxygen concentration of the silicon wafer, the heat treatment temperature and the heat treatment time of the heat treatment are predetermined so that oxygen concentration at an interface between the epitaxial layer and the silicon wafer of the silicon epitaxial wafer may be $1\times10^{17}$ to $1\times10^{18}$ atoms/cm³ or $5\times10^{16}$ to $5\times10^{17}$ atoms/cm³. There is provided a silicon epitaxial wafer comprising an epitaxial layer formed on a silicon wafer wherein Erratic phenomenon does not occur in a MOS device and a method for producing it.

3 Claims, 5 Drawing Sheets

(a)

(b)

SILICON EPITAXIAL WAFER AND A METHOD FOR PRODUCING IT

BACKGROUND OF THE INVENTION

1. Field of the Invention

The present invention relates to a silicon epitaxial wafer used for fabrication of a semiconductor device such as IC, LSI or the like, and a method for producing it.

2. Description of the Related Art

Along with a recent tendency to increase the degree of integration, there has been an increasing demand for silicon wafers having high quality. As a wafer for fabrication of a device, a silicon epitaxial wafer having a very excellent quality has been mainly used. FIG. 1 shows a section of a silicon epitaxial wafer, which is one example of an epitaxial silicon wafer 3 wherein a epitaxial layer 2 is grown on a silicon wafer 1 as a substrate. It is important to obtain a silicon epitaxial wafer having more excellent quality in order to achieve finer pattern, higher density, higher speed and higher yield in a semiconductor integrated circuit.

For example, a silicon epitaxial wafer is used for fabrication of Metal Oxide Semiconductor (MOS) type semiconductor apparatus, so-called MOS device or the like. FIGS. 3(a), (b) are views showing a structure of one example of MOS device, which is one example of MOS device wherein a lot of LOCOS patterns are aligned. FIG. 3(a) is a top plan view of the MOS device, and FIG. 3(b) is a sectional view of the MOS device. In the figure, a gate oxide film 4 is formed on the silicon epitaxial wafer 3 as a base, on which a gate electrode 5 made of a polycrystalline silicon is formed. Both ends of the gate oxide film 4 is an oxide film 6 called so-called LOCOS oxide film that is a thick insulation separation film insulating each of devices electrically.

One of methods for evaluating quality of a silicon epitaxial wafer used for fabrication of such MOS device is dielectric breakdown property for confirming electrical characteristics of oxide film in MOS device. Examples of other methods include methods for evaluating quality such as Liquid Crystal Thermal Mapping (G. J. West, "A simple technique for analysis of ESD failure of dynamic RAMs using liquid crystals", in Proc. IEEE Int. Rel. Phys. Symp., 185(1982).), Visible and Infrared radiation emission (K. S. Wills, C. Duvvury, and O. Adams, "Photoemission testing for ESD failures, advantages and limitations", in EOS/ESD Symp. Proc., 53(1988).) IR microscopy (C. E. Stephens and C. T. Amos, "A study of EOS in microcircuits using the infra-red microscope", in EOS/ESD Symp. Proc., 219(1986).), or the like. They are very effective means for specifying a certain failure part in MOS device.

However, there have been sometimes occurred a failure called so-called Erratic phenomenon wherein a failure part in a device changes with time in a MOS device. The wafer where Erratic phenomenon occurs may lead to a problem that a yield is reduced in fabrication of MOS device. According to the above-mentioned method for analyzing failures, a failure part can be specified, but it is quite difficult to analyze Erratic phenomenon. Because, even though information of a failure part can be obtained each time, the failure part changes with passing time. There have been found no wafers wherein Erratic phenomenon can be prevented, and no condition for production of the wafer.

As methods for measuring reliability of the oxide film conventionally used, TZDB (Time Zero Dielectric Breakdown) method, and TDDB (Time Dependent Dielectric Breakdown) method are known. In these methods, electric field is applied to a semiconductor substrate having MOS structure in direction of accumulation so that carrier can be collected right under the gate oxide film for evaluation.

However, in an actual device, a diffusion layer is formed to the depth of several $\mu$m from the surface of the silicon wafer right below the gate oxide film, and is used as a device area. These methods for evaluating electrical failure only with information from a gate oxide film, do not always reflect yield of actual device.

As methods for evaluation compensating the disadvantage, there have been developed methods for evaluation using OBIC or EBIC described below (See Japanese patent application laid-open(kokai) No. 11-216683). The method comprising applying voltage to a semiconductor substrate having MOS structure in a direction of formation of depletion layer, and measuring OBIC or EBIC generated in MOS device by irradiating with laser or electron beam with varying applied voltage.

According to the method, evaluation of not only a gate oxide film but also a substrate surface layer part right below the gate oxide film are possible, and thus characteristic failure that cannot be detected by conventional TZDB method or TDDB method.

The inventors tried evaluation of silicon epitaxial wafer by the method, and found that there is an apparent difference in results of evaluation among wafers wherein good evaluation results can be obtained according to conventional method, namely evaluation of quality with higher sensitivity compared with a conventional method is possible.

SUMMARY OF THE INVENTION

The present invention has been accomplished to solve the above-mentioned problems, and an object of the present invention is to provide a silicon epitaxial wafer wherein Erratic phenomenon that failure part changes with passing time in a MOS device does not occur, and a method for producing it.

Another object of the present invention is to provide a silicon epitaxial wafer wherein good characteristics of certain level or more can be achieved when evaluating MOS characteristics by a method for evaluation with high sensitivity by the above-mentioned OBIC or EBIC.

In order to achieve the above objects, the present invention provides a silicon epitaxial wafer comprising an epitaxial layer formed on a silicon wafer wherein Erratic phenomenon does not occur in a MOS device fabricated on the silicon epitaxial wafer.

As described above, according to the present invention, the silicon epitaxial wafer wherein Erratic phenomenon does not occur in a MOS device fabricated on the silicon epitaxial wafer can be provided, so that yield of the MOS device can be significantly improved.

The present invention also relates to a silicon epitaxial wafer comprising an epitaxial layer formed on a silicon wafer wherein oxygen concentration at an interface between the epitaxial layer and the silicon wafer of the silicon epitaxial wafer is $1\times10^{17}$ to $1\times10^{18}$ atoms/cm$^3$.

As described above, a silicon epitaxial wafer wherein oxygen concentration at an interface between the epitaxial layer and the silicon wafer of the silicon epitaxial wafer is $1\times10^{17}$ to $1\times10^{18}$ atoms/cm$^3$ can be a silicon epitaxial wafer wherein Erratic phenomenon can be surely prevented.

The present invention also relates to a silicon epitaxial wafer comprising an epitaxial layer formed on a silicon wafer characterized in that OBIC image or EBIC image of MOS capacitor produced on the silicon epitaxial wafer begins to be observed when the voltage applied to the MOS capacitor is 20 MV/cm or more.

As described above, in the silicon epitaxial wafer characterized in that OBIC image or EBIC image of MOS capacitor produced on the silicon epitaxial wafer begins to be observed when the voltage applied to the MOS capacitor is 20 MV/cm or more, namely, oxide dielectric breakdown voltage is 20 MV/cm or more, a margin until a failure such as Erratic phenomenon occurs is larger compared to an operating condition of an actual MOS device. Accordingly, an excellent performance wherein substantially no Erratic phenomenon occurs can be achieved.

The present invention also relates to a silicon epitaxial wafer comprising an epitaxial layer formed on a silicon wafer wherein oxygen concentration at an interface between the epitaxial layer and the silicon wafer of the silicon epitaxial wafer is $5 \times 10^{16}$ to $5 \times 10^{17}$ atoms/cm$^3$.

As described above, a silicon epitaxial wafer wherein oxygen concentration at an interface between the epitaxial layer and the silicon wafer of the silicon epitaxial wafer is $5 \times 10^{16}$ to $5 \times 10^{17}$ atoms/cm$^3$ has good oxide film characteristics of 20 MV/cm or more when evaluating MOS characteristics using a method for evaluation with high sensitivity by the OBIC or EBIC, since the oxygen concentration at the interface is $5 \times 10^{17}$ atoms/cm$^3$ or less. Furthermore, an advantage that heat treatment time can be short before epitaxial growth can be achieved, since the oxygen concentration at the interface is $5 \times 10^{16}$ atoms/cm$^3$ or more. Furthermore, since oxide dielectric breakdown voltage is 20 MV/cm or more, a margin until a failure such as Erratic phenomenon occurs is larger compared to an operating condition of an actual MOS device. Accordingly, an excellent performance wherein substantially no Erratic phenomenon occurs can be achieved.

The present invention also relates to a method for producing a silicon epitaxial wafer comprising subjecting a silicon wafer to heat treatment in an atmosphere containing hydrogen, and then growing an epitaxial layer on the silicon wafer wherein initial oxygen concentration of the silicon wafer and heat treatment temperature and heat treatment time of the heat treatment are predetermined so that oxygen concentration at an interface between the epitaxial layer and the silicon wafer of the silicon epitaxial wafer may be $1 \times 10^{17}$ to $1 \times 10^{18}$ atoms/cm$^3$.

As described above, if initial oxygen concentration of the silicon wafer and heat treatment temperature and heat treatment time are predetermined so that oxygen concentration at an interface between the epitaxial layer and the silicon wafer of the silicon epitaxial wafer may be $1 \times 10^{17}$ to $1 \times 10^{18}$ atoms/cm$^3$ in a method for producing a silicon epitaxial wafer comprising subjecting a silicon wafer to heat treatment in an atmosphere containing hydrogen, and then growing an epitaxial layer on the silicon wafer, oxygen on the surface of the wafer can be out-diffused, so that oxygen at the interface can be the above-mentioned desired value. Thereby a silicon epitaxial wafer wherein Erratic phenomenon does not occur when MOS device is fabricated thereon can be surely produced.

In that case, it is preferable that the initial oxygen concentration of the silicon wafer is $8.0 \times 10^{17}$ to $1.2 \times 10^{18}$ atoms/cm$^3$ (ASTM'79 conversion), the temperature of the heat treatment in an atmosphere containing hydrogen is 1000 to 1200° C., and the heat treatment time is 30 to 500 seconds.

Because, when the initial oxygen concentration of the silicon wafer is $8.0 \times 10^{17}$ to $1.2 \times 10^{18}$ atoms/cm$^3$, the temperature of the heat treatment in an atmosphere containing hydrogen is 1000 to 1200° C., and the heat treatment time is 30 to 500 seconds in the method for producing a silicon epitaxial wafer, oxygen concentration in a bulk part of the silicon wafer can be high so that sufficient gettering effect and mechanical strength can be achieved, and oxygen concentration at an interface between the epitaxial layer and the silicon wafer can be reduced by out-diffusing oxygen on the surface, and thereby a silicon epitaxial wafer wherein Erratic phenomenon does not occur can be surely produced.

The present invention also relates to a method for producing a silicon epitaxial wafer comprising subjecting a silicon wafer to heat treatment in an atmosphere containing hydrogen, and then growing an epitaxial layer on the silicon wafer wherein the initial oxygen concentration of the silicon wafer, the heat treatment temperature and the heat treatment time of the heat treatment are predetermined so that oxygen concentration at an interface between the epitaxial layer and the silicon wafer of the silicon epitaxial wafer may be $5 \times 10^{16}$ to $5 \times 10^{17}$ atoms/cm$^3$.

As described above, if the initial oxygen concentration of the silicon wafer, the heat treatment temperature and the heat treatment time of the heat treatment are predetermined so that the oxygen concentration at an interface between the epitaxial layer and the silicon wafer of the silicon epitaxial wafer may be $5 \times 10^{16}$ to $5 \times 10^{17}$ atoms/cm$^3$ in a method for producing a silicon epitaxial wafer comprising subjecting a silicon wafer to heat treatment in an atmosphere containing hydrogen, and then growing an epitaxial layer on the silicon wafer, oxygen on the surface of the wafer can be out-diffused, so that the oxygen concentration at the interface can be the above-mentioned desired value. Thereby there can be obtained a silicon epitaxial wafer wherein the oxygen concentration is $5 \times 10^{17}$ atoms/cm$^3$ or less, and good oxide film characteristics of 20 MV/cm or more when evaluating MOS characteristics using a method for evaluation with high sensitivity by the OBIC or EBIC. Furthermore, since there can be obtained such a wafer having high oxide dielectric breakdown voltage, a margin until Erratic phenomenon or the like occurs gets large, so that a wafer wherein such a failure is not occurred substantial can be produced. Less than $5 \times 10^{16}$ atoms/cm$^3$ of oxygen concentration is not practical, since heat treatment before epitaxial growth time gets long in that case. Accordingly, $5 \times 10^{16}$ atoms/cm$^3$ or more of oxygen concentration is preferable.

In that case, it is preferable that the initial oxygen concentration of the above-mentioned silicon wafer is $8.0 \times 10^{17}$ to $1.2 \times 10^{18}$ atoms/cm$^3$, the temperature of the heat treatment in an atmosphere containing hydrogen is 1000 to 1200° C., and the heat treatment time is 50 to 1000 seconds.

As described above, if the heat treatment time is 50 to 1000 seconds in order to achieve the above-mentioned desired concentration of oxygen at the interface, there can be produced a silicon epitaxial wafer having good oxide film characteristics of 20 MV/cm or more even when evaluating MOS characteristics using a method for evaluation with high sensitivity by the OBIC or EBIC.

As explained above, according to the present invention, there can be produced a silicon epitaxial wafer wherein Erratic phenomenon that failure part changes with time in a MOS device does not occur, and a silicon epitaxial wafer having good oxide dielectric breakdown voltage characteristics when it is evaluated by a method for evaluation of oxide film characteristics with high sensitivity. The present invention can contribute to improvement in yield of MOS device.

DESCRIPTION OF THE INVENTION AND A PREFERRED EMBODIMENT

Figure 1:
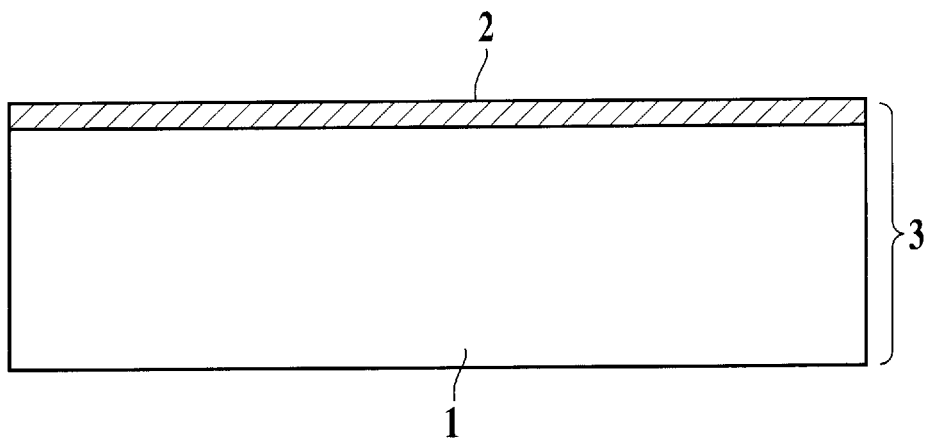
FIG. 1 is a sectional view of the epitaxial wafer.

The present invention will be further described below in detail, but is not limited thereto.

As described above, it is quite difficult to analyze Erratic phenomenon according to a conventional method for evaluating quality of a silicon epitaxial wafer, and there has not been found a wafer wherein Erratic phenomenon does not occur and production condition for producing the wafer.

The inventors of the present invention have studied production condition for the epitaxial wafer and occurrence of Erratic phenomenon according to a method of evaluating Erratic phenomenon with OBIC (Optical Beam Induced Current) method or EBIC (Electron Beam Induced Current) method (Japanese Patent Application No.11-67532), which have been previously developed, and are very suitable for analysis of Erratic phenomenon. As a result, they have found that Erratic phenomenon can be surely prevented when the oxygen concentration at an interface between the epitaxial layer and the silicon wafer is $1\times10^{17}$ to $1\times10^{18}$ atoms/cm$^3$, and therby completed the present invention.

Precise theory as for cause of occurrence of Erratic phenomenon in epitaxial silicon wafer has not been known yet. However, it is presumed that when the interstitial oxygen at the interface is less than $1\times10^{17}$ atoms/cm$^3$, strength of the silicon wafer is lowered, dislocation easily occurs near the interface due to epitaxial growth, and the gettering effect is lowered, and on the contrary, when it is more than $1\times10^{18}$ atoms/cm$^3$, amount of oxygen incorporated in the epitaxial layer is increased, a film quality of the epitaxial layer is lowered. They may be a cause of Erratic phenomenon.

The inventors have also studied a method for producing a silicon epitaxial wafer of the present invention wherein oxygen concentration at an interface between an epitaxial layer and a silicon wafer is in the range of $1\times10^{17}$ to $1\times10^{18}$ atoms/cm$^3$. It is possible to allow oxygen concentration at the interface between an epitaxial layer and a silicon wafer to be in the range of $1\times10^{17}$ to $1\times10^{18}$ atoms/cm$^3$ by depositing an epitaxial layer on a silicon wafer having oxygen concentration of $1\times10^{17}$ to $1\times10^{18}$ atoms/cm$^3$. However, a silicon wafer having oxygen concentration of $1\times10^{17}$ to $1\times10^{18}$ atoms/cm$^3$ has relatively low oxygen concentration, sufficient mechanical strength of the substrate itself and gettering effect cannot always be achieved.

According to a method of the present invention, a silicon wafer is subjected to heat treatment in an atmosphere containing hydrogen, and then an epitaxial layer is grown on the silicon wafer. As described above, if the hydrogen heat treatment is conducted, an epitaxial layer can be grown and deposited after oxygen near the surface of the substrate is out-diffused, so that oxygen concentration at an interface between the epitaxial layer and the silicon wafer can be controlled to be in the range of $1\times10^{17}$ to $1\times10^{18}$ atoms/cm$^3$, and mechanical strength is not impaired, since the substrate itself has high oxygen concentration. Furthermore, if suitable oxygen precipitation heat treatment is additionally conducted, sufficient gettering effect can be achieved.

In order to control oxygen concentration at the interface to be in the range of $1\times10^{17}$ to $1\times10^{18}$ atoms/cm$^3$, initial oxygen concentration of the silicon wafer as a substrate and heat treatment temperature and heat treatment time of the hydrogen heat treatment should be suitably defined. The inventors have studied and investigated, and found that when the initial oxygen concentration of the silicon wafer is $8.0\times10^{17}$ to $1.2\times10^{18}$ atoms/cm$^3$ (ASTM'79 conversion), temperature of the heat treatment in an atmosphere containing hydrogen is 1000 to 1200° C., and heat treatment time is 30 to 500 seconds interstitial oxygen near the surface of the substrate can be out-diffused, and the oxygen concentration at the interface can be surely controlled to be in the range of $1\times10^{17}$ to $1\times10^{18}$ atoms/cm$^3$. Furthermore, oxygen concentration in the bulk part of the substrate can be high thereby, so that mechanical strength can also be maintained.

In the case that oxygen concentration at the interface is controlled to be in the range of $5\times10^{16}$ to $5\times10^{17}$ atoms/cm$^3$, a similar method to that described above can be used. However, heat treatment time should be longer, since the range of oxygen concentration to be controlled is lower.

Embodiment of the present invention will be specifically explained below, referring to the attached drawings, but the present invention is not limited thereto.

The following is a brief explanation about OBIC method and EBIC method adopted in order to find a silicon epitaxial wafer of the present invention and a method for producing it.

OBIC method is a method for detecting carrier generated by light. More specifically, it is a method of evaluating phenomenon in a semiconductor by taking out carrier generated by irradiation of light having a larger energy than bandgap energy of the semiconductor as electric current. EBIC method is a method of evaluation wherein carrier is injected using electron beam instead of light used in OBIC method.

Figure 4:
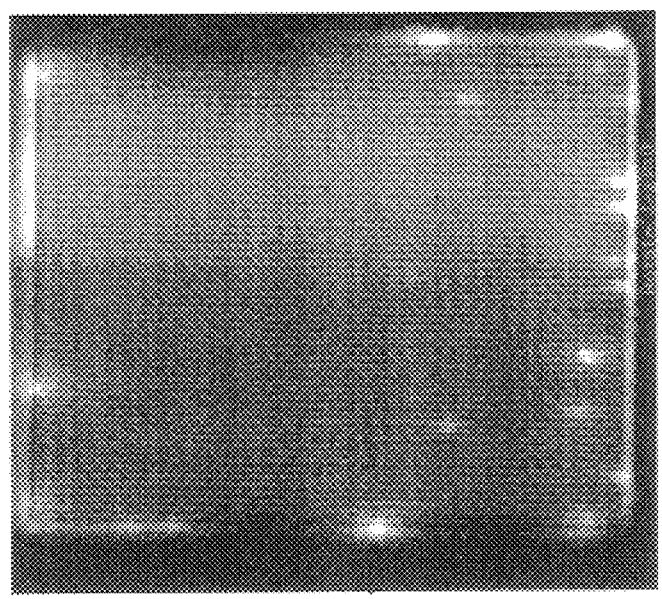
FIG. 4 is a figure showing results of evaluation of Erratic phenomenon according to OBIC, (a) is a figure showing a result of the first evaluation, (b) is a figure showing a result of the second evaluation.
Figure 4:
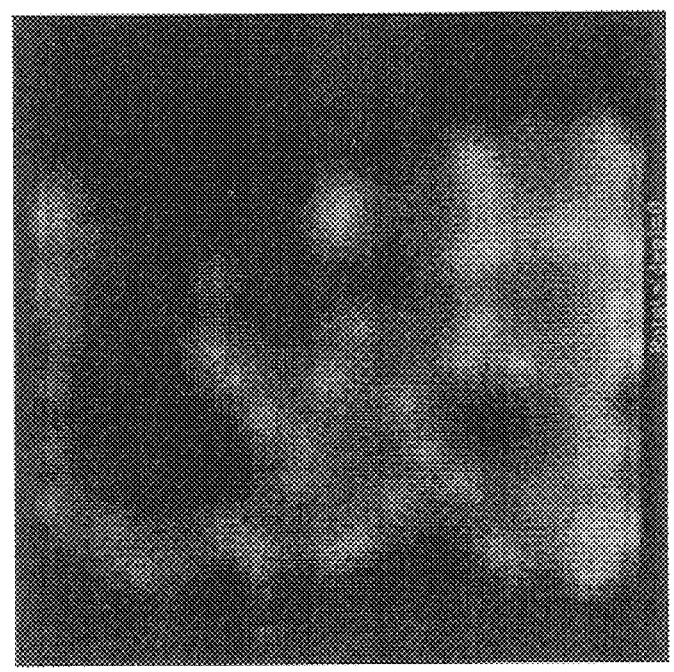

FIG. 4 shows one example of results of evaluation of Erratic phenomenon according to OBIC method. Evaluation is conducted by applying voltage in direction that depletion layer is formed on a silicon substrate. Applied voltage is defined depending on a thickness of a gate oxide film. OBIC is observed with applying voltage in the range of 2 to 40 MV/cm as electric field strength. When the applied voltage is increased from 0 to a direction of plus, strong OBIC is observed on the whole surface of MOS device at about 5 to 10 MV/cm calculated electric field strength applied to the oxide film, and OBIC image can be observed in many places of MOS device (FIG. 4(a)).

If observation is continued in the above state, OBIC image (FIG. 4(b)) can be obtained at a different part from the above part (FIG. 4(a)). Thereby, Erratic phenomenon can be easily analyzed according to OBIC method.

According to the present invention, there were found a wafer structure and a method for producing the wafer as a result of various studies and investigation based on the results of analysis of Erratic phenomenon in accordance with the above-mentioned OBIC method or EBIC method. The following is one example of a method for producing a silicon epitaxial wafer of the present invention.

Figure 2:
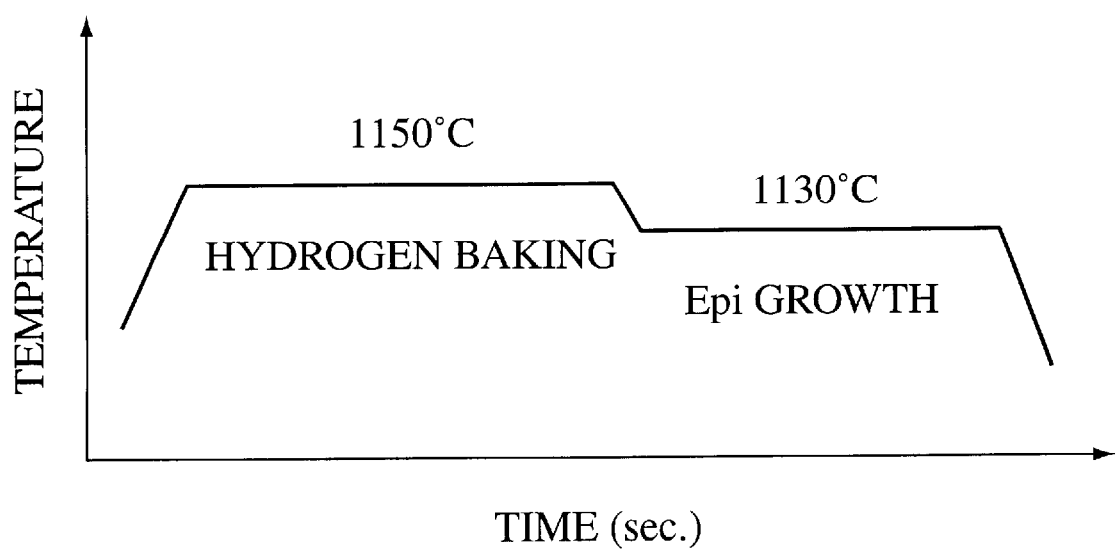
FIG. 2 is a figure showing one example of sequence in production according to the method of the present invention.

FIG. 2 shows one example of a sequence on production of the silicon epitaxial wafer. The figure shows a sequence of heat treatment in an atmosphere containing hydrogen conducted for removal of a natural oxide film existing on the silicon wafer and out-diffusion of interstitial oxygen near the surface, and growth of epitaxial layer. The method for production of the present invention consists of conducting heat treatment under certain condition before growth of epitaxial layer on a silicon wafer as a substrate, in a general method for producing a silicon epitaxial wafer, and thus it is quite simple.

A silicon wafer as a substrate for epitaxial growth is prepared first. It is preferable to use a silicon wafer having initial oxygen concentration of $8.0 \times 10^{17}$ to $1.2 \times 10^{18}$ atoms/$cm^3$ (ASTM'79 conversion) as measured by infrared absorption spectroscopy, since the oxygen concentration is not so low that a mechanical strength is impaired, and not so high that it takes too much time to out-diffuse interstitial oxygen near the surface.

When heat treatment temperature of the heat treatment in an atmosphere containing hydrogen is 1000 to 1200° C., and heat treatment time is 30 to 500 seconds, oxygen concentration near the surface of the silicon wafer can be surely in the range of $1 \times 10^{17}$ to $1 \times 1018$ atoms/$cm^3$, and at the same time mechanical strength of the substrate can be maintained.

In order to make the oxygen concentration at the interface in the range of $5 \times 10^{16}$ to $5 \times 10^{17}$ atoms/$cm^3$, the above-mentioned heat treatment time is defined to be 50 1000 seconds.

In order to conduct the heat treatment, any type of heat treatment furnace commercially available can be utilized, as far as it is a heat treatment furnace wherein cleanness is controlled. For example, a heater heating horizontal type or vertical type diffusion furnace can be used, or a lamp heating type single wafer processing wafer heating apparatus can be used.

Then, epitaxial growth is conducted on the surface of the silicon wafer. The epitaxial growth can be conducted by a method conventionally conducted. For example, a wafer as a substrate is placed in an epitaxial growth furnace, and $SiHCl_3+H_2$ is introduced into the furnace with heating the inside of the furnace at 1100 to 1200° C., to conduct epitaxial growth of silicon on the silicon wafer.

The above-mentioned heat treatment in a hydrogen atmosphere can be conducted in an epitaxial growth furnace in which epitaxial growth is to be conducted, as shown in FIG. 2, and then epitaxial growth can be conducted. Alternatively, it can be conducted separately using a different furnace.

Figure 3A:
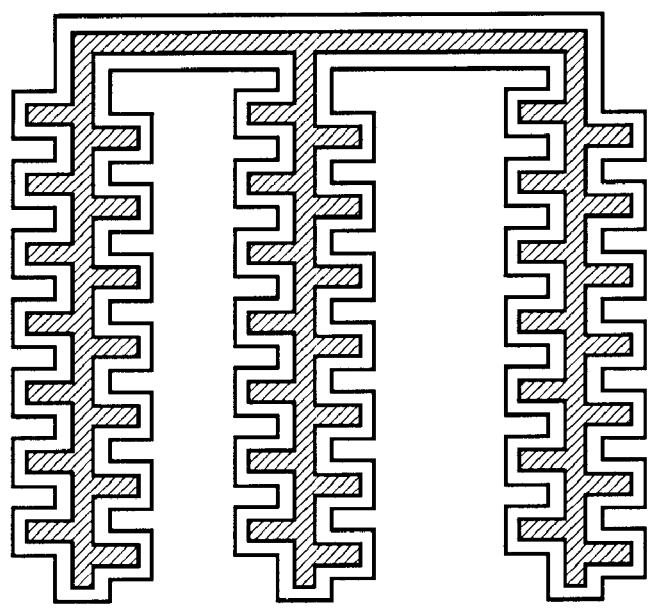
FIG. 3(a),(b) are views showing a MOS device wherein a lot of LOCOS patterns are aligned, (a) is a top plan view of the MOS device, and (b) is a sectional view of the MOS device.
Figure 3B:
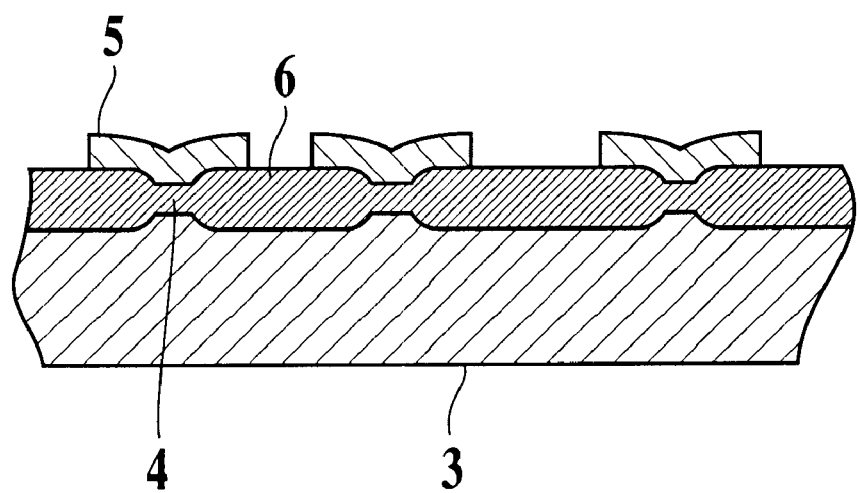

As described above, there can be obtained the silicon epitaxial wafer of the present invention wherein oxygen concentration at an interface between the epitaxial layer and the a silicon wafer is $1 \times 10^{17}$ to $1 \times 10^{18}$ atoms/$cm^3$ or $5 \times 10^{16}$ to $5 \times 10^{17}$ atoms/$cm^3$. The wafer can contribute to improvement in yield of MOS device, since Erratic phenomenon hardly occurs when MOS device as shown in FIG. 3 is produced.

EXAMPLES

The present invention will be explained more in detail with examples of the present invention. These examples are not intended to limit the scope of the present invention.

Example 1, Comparative Example 1

The silicon wafer to be used as a sample for a substrate was p+ substrate (resistivity of 0.01 Ω.cm) in which boron is doped in high concentration having a diameter of 200 mm. Two kinds of wafers each having initial oxygen concentration of $9.6 \times 10^{17}$ atoms/$cm^3$ and $1.1 \times 10^{18}$ atoms/$cm^3$ respectively (ASTM'79 conversion) were prepared.

These silicon wafers were subjected to two kinds of heat treatment in an atmosphere containing hydrogen at 1150° C. for 65 seconds or 600 seconds, and 6 μm of epitaxial layer was grown at 1130° C. by epitaxial growth. Only the wafer having initial oxygen concentration of $1.1 \times 10^{18}$ atoms/$cm^3$ was subjected to the heat treatment in an atmosphere containing hydrogen at 1150° C. for 5 seconds. The heat treatment furnace used for heat treatment in a hydrogen atmosphere and epitaxial growth was a furnace wherein a susceptor on which a silicon wafer was placed, was located in a single wafer processing epitaxial growing apparatus, and heating measure was lamp heating type. Using the heat treatment furnace, heat treatment in a hydrogen atmosphere is first conducted, and then hydrogen atmosphere is evacuated, and an epitaxial layer was grown on the silicon wafer by introducing $SiHCl_3$ into the furnace.

MOS capacitor separated by LOCOS structure was produced on the wafer. Thickness of the gate oxide film of the MOS capacitor was about 10 nm.

As an apparatus for evaluating oxide film failure according to OBIC, digital OBIC scanner JDLM-6602E (brand name, manufactured by Nihondenshi corporation).

After evaluation of the wafer according to OBIC, the surface of the wafer was etched with a stock removal of about 5 μm, oxygen concentration was measured in a depth direction from the surface with SIMS (Secondary Ion Mass Spectroscopy), and oxygen concentration at an interface between epitaxial layer and silicon wafer was compared.

Figure 5:
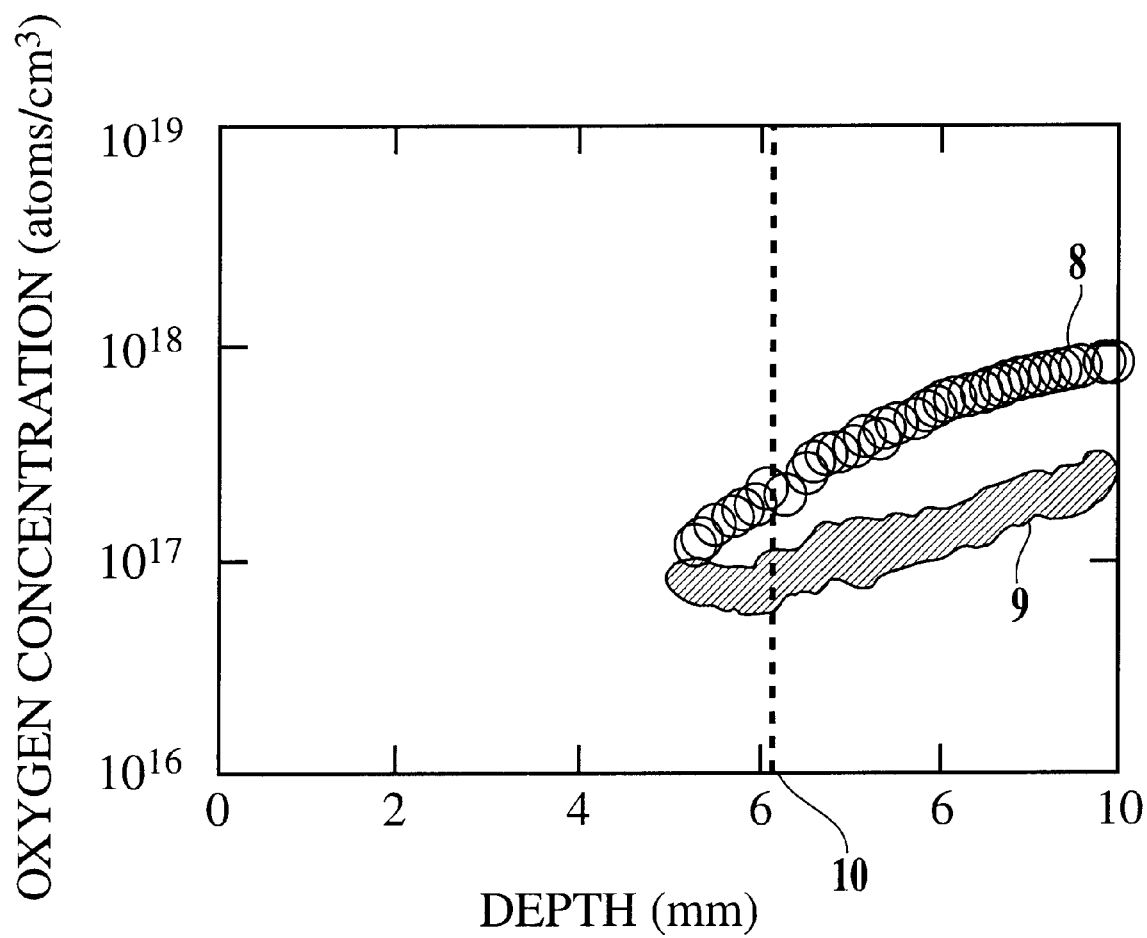
FIG. 5 is a figure showing a result of evaluation of oxygen concentration of silicon epitaxial wafer with SIMS.

The results were shown in Table 1. FIG. 5 is one example of evaluation of oxygen concentration of silicon epitaxial wafer (as for the wafer wherein initial oxygen concentration is $1.1 \times 10^{18}$ atoms/$cm^3$, as for the wafer wherein heat treatment time is 65 seconds or 600 seconds) with SIMS in a depth direction from the surface.

TABLE 1

| initial oxygen concentration | $9.6 \times 10^{17}$ (atoms/$cm^3$) | | | $1.1 \times 10^{18}$ (atoms/$cm^3$) | |
| --- | --- | --- | --- | --- | --- |
| Hydrogen heat treatment time | 65 sec | 600 sec | 5 sec | 65 sec | 600 sec |
| oxygen concentration at interface (atoms/$cm^3$) | $3.0 \times 10^{17}$ | $7.0 \times 10^{16}$ | $1.05 \times 10^{18}$ | $3.5 \times 10^{17}$ | $9.0 \times 10^{16}$ |
| Erratic phenomenon | No Occur | Occur | Occur | No Occur | Occur |

As shown in Table 1, Erratic phenomenon did not occur in the silicon epitaxial wafer of the present invention wherein oxygen concentration at an interface between the epitaxial layer and the silicon wafer may be $1 \times 10^{17}$ to $1 \times 10^{18}$ atoms/$cm^3$, and thus it was found that the wafer had good quality. On the contrary, Erratic phenomenon occurred in the wafer having slightly lower oxygen concentration at the interface than the range of the present invention.

As shown in FIG. 5, when oxygen concentration of the substrate was measured by SIMS, oxygen concentration at the interface was lower than $1 \times 10^{17}$ atoms/$cm^3$ in the wafer wehrein Erratic phenomenon was observed (the wafer subjected to heat treatment in a hydrogen atmosphere for 600 seconds).

Example 2

MOS capacitor was produced under the same condition as Example 1 and Comparative Example 1 except that wafers having initial oxygen concentration of $1.0\times10^{18}$ atoms/cm$^3$ and $1.2\times10^{18}$ atoms/cm$^3$ (ASTM'79 conversion) were used, and oxygen concentration at an interface between the epitaxial layer and the silicon wafer and Erratic phenomenon were evaluated. The results were shown in Table 2.

There was conducted at the same time evaluation wherein an applied volatage to MOS capacitor when OBIC image begins to be observed was defined to be oxide dielectric breakdown voltage characteristics. The results were shown in Table 2 and FIG. 6.

TABLE 2

| initial oxygen concentration | $1.0 \times 10^{18}$ (atoms/cm$^3$) | | $1.2 \times 10^{18}$ (atoms/cm$^3$) | |
| --- | --- | --- | --- | --- |
| Hydrogen heat treatment time | 65 sec | 600 sec | 65 sec | 600 sec |
| oxygen concentration at interface (atoms/cm$^3$) | $5.0 \times 10^{17}$ | $8.0 \times 10^{16}$ | $9.0 \times 10^{17}$ | $9.8 \times 10^{16}$ |
| Erratic phenomenon | No Occur | Occur | No Occur | Occur |
| oxide dielectric breakdown voltage | 21 MV/cm | 29 MV/cm | 10 MV/cm | 24 MV/cm |

Figure 6:
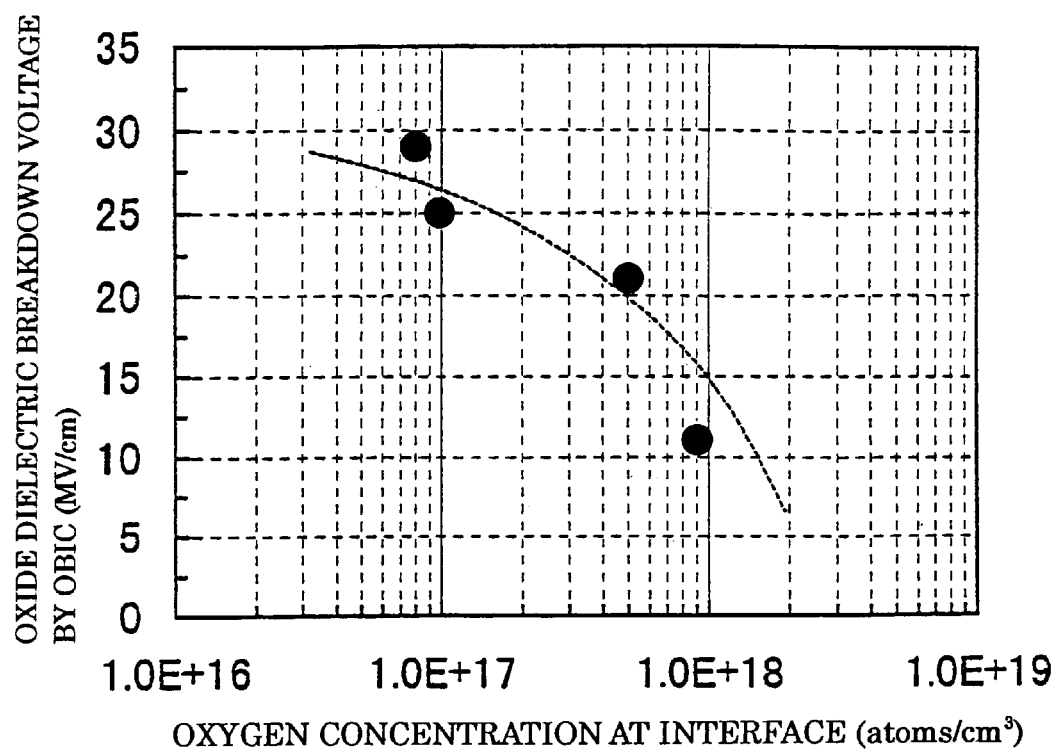
FIG. 6 is a figure showing a relation of oxygen concentration at interface and oxide dielectric breakdown voltage according to OBIC.

As shown in Table 2 and FIG. 6, when oxygen concentration at the interface was lower, oxide dielectric breakdown voltage was improved more. When it was $5.0\times10^{17}$ atoms/cm$^3$ or less, oxide dielectric breakdown voltage of 20 MV/cm or more can be surely achieved. Erratic phenomenon did not occur as in Example 1, when oxygen concentration at an interface is in the range of $1.0\times10^{17}$ atoms/cm$^3$ to $1.0\times10^{18}$ atoms/cm$^3$. Accordingly, in order to an epitaxial wafer wherein Erratic phenomenon does not occur and oxide film characteristics are excellent, oxygen concentration at an interface in the range of $1.0\times10^{17}$ atoms/cm$^3$ to $5.0\times10^{17}$ atoms/cm$^3$ is preferable.

However, in table 2, samples having oxygen concentration at an interface less than $1.0\times10^{17}$ atoms/cm$^3$ wherein Erratic phenomenon was observed had oxide dielectric breakdown voltage of 29 MV/cm and 24 MV/cm, which were higher than those of sample wherein Erratic phenomenon was not observed. It shows that Erratic phenomenon does not occur in these samples, unless voltage of electric field strength of 29 MV/cm or 24 MV/cm is not applied. Generally, in semiconductor device such as IC, LSI or the like, electric field strength applied to an oxide film is about several MV/cm even in an accelerating test conducted under severer condition. They are not used under the condition such that Erratic phenomenon occurs in these samples sample. Accordingly, in epitaxial wafers having high oxide dielectric breakdown voltage characteristics such as these samples, a margin until Erratic phenomenon occurs can be large, and the wafer wherein Erratic phenomenon does not occur substantially in a semiconductor device can be provided.

The present invention is not limited to the above-described embodiment. The above-described embodiment is a mere example, and those having substantially the same structure as that described in the appended claims and providing the similar action and effects are all included in the scope of the present invention.

What is claimed is:

1. A silicon epitaxial wafer comprising an epitaxial layer formed on a silicon wherein oxygen concentration at an interface between the epitaxial layer and the silicon wafer of the silicon epitaxial wafer is $1\times10^{17}$ to $1\times10^{18}$ atoms/cm$^3$, and wafer wherein an Erratic phenomenon, where a failure part in a device changes with time, does not occur in a MOS device fabricated on the silicon epitaxial wafer.

2. A silicon epitaxial wafer comprising an epitaxial layer formed on a silicon wherein oxygen concentration at an interface between the epitaxial layer and the silicon wafer of the silicon epitaxial wafer is $5\times10^{16}$ to $5\times10^{17}$ atoms/cm$^3$, and wafer wherein an OBIC image or an EBIC image of a MOS capacitor, evaluated using an OBIC method or an EBIC method, respectively, produced on the silicon epitaxial wafer begins to be observed when the voltage applied to the MOS capacitor is 20 MV/cm or more.

3. A silicon epitaxial wafer comprising an epitaxial layer formed on a silicon wafer wherein oxygen concentration at an interface between the epitaxial layer and the silicon wafer of the silicon epitaxial wafer is $5\times10^{16}$ to $5\times10^{17}$ atoms/cm$^3$, and wherein said silicon epitaxial wafer has an oxide film characteristic of 20 MV/cm or more when an MOS characteristic is evaluated using an OBIC method or an EBIC method.

* * * * *